United States Patent
Kanai

(10) Patent No.: US 8,210,831 B2
(45) Date of Patent: Jul. 3, 2012

(54) PIEZOELECTRIC PUMP

(75) Inventor: Shungo Kanai, Oumihachiman (JP)

(73) Assignee: Murata Manufacturing Co., Ltd., Kyoto (JP)

(*) Notice: Subject to any disclaimer, the term of this patent is extended or adjusted under 35 U.S.C. 154(b) by 450 days.

(21) Appl. No.: 12/434,700

(22) Filed: May 4, 2009

(65) Prior Publication Data

US 2009/0214362 A1 Aug. 27, 2009

Related U.S. Application Data

(63) Continuation of application No. PCT/JP2008/071607, filed on Nov. 28, 2008.

(30) Foreign Application Priority Data

Dec. 3, 2007 (JP) ................................. 2007-311905

(51) Int. Cl.
 *F04B 17/00* (2006.01)
(52) U.S. Cl. ..................... 417/413.2; 310/324; 310/332
(58) Field of Classification Search ............... 417/413.2; 310/330, 331, 332, 324, 325
 See application file for complete search history.

(56) References Cited

U.S. PATENT DOCUMENTS

| | | | | |
|---|---|---|---|---|
| 4,648,807 A | * | 3/1987 | Tippetts et al. | 417/413.2 |
| 4,939,405 A | * | 7/1990 | Okuyama et al. | 417/413.2 |
| 5,215,446 A | * | 6/1993 | Takahashi et al. | 417/322 |
| 5,354,032 A | * | 10/1994 | Sims et al. | 251/129.06 |
| 6,262,519 B1 | * | 7/2001 | Furlani et al. | 310/358 |
| 6,505,919 B1 | | 1/2003 | Mizutani | |
| 7,198,250 B2 | * | 4/2007 | East | 417/413.2 |
| 7,431,574 B2 | * | 10/2008 | Onishi | 417/413.2 |
| 7,498,718 B2 | * | 3/2009 | Vogeley | 310/324 |
| 2005/0139002 A1 | * | 6/2005 | Onishi | 73/168 |
| 2006/0056999 A1 | * | 3/2006 | East | 417/413.2 |
| 2006/0067840 A1 | * | 3/2006 | Kawakubo et al. | 417/413.2 |
| 2006/0232166 A1 | * | 10/2006 | Vogeley | 310/324 |
| 2007/0228893 A1 | | 10/2007 | Yamauchi et al. | |

FOREIGN PATENT DOCUMENTS

| | | |
|---|---|---|
| JP | 03-134271 A | 6/1991 |
| JP | 08-293632 A | 11/1996 |
| JP | 2001-260348 A | 9/2001 |
| JP | 2006-220056 A | 8/2006 |
| JP | 2006-304021 A | 11/2006 |
| JP | 2008-223754 A | 9/2008 |
| WO | 2007/097077 A1 | 8/2007 |
| WO | 2008/007634 A1 | 1/2008 |

OTHER PUBLICATIONS

Official Communication issued in International Patent Application No. PCT/JP2008/071607, mailed on Jan. 27, 2009.

* cited by examiner

*Primary Examiner* — Peter J Bertheaud
(74) *Attorney, Agent, or Firm* — Keating & Bennett, LLP

(57) ABSTRACT

A piezoelectric pump includes a diaphragm that defines a pump chamber between the diaphragm and a pump body, and a piezoelectric element bonded to a surface of the diaphragm. The piezoelectric element is a bimorph piezoelectric element in which a plurality of piezoelectric layers are stacked, including a neutral layer disposed in the approximate middle of the piezoelectric element in the thickness direction and that is not displaced. The piezoelectric element can be efficiently displaced because a neutral plane of the diaphragm and the piezoelectric element bonded therein is located in the neutral layer.

3 Claims, 4 Drawing Sheets

↔ EXPANSION
⤚ CONTRACTION

↔ EXPANSION
⤚ CONTRACTION

PIEZOELECTRIC PUMP

BACKGROUND OF THE INVENTION

1. Field of the Invention

The present invention relates to a piezoelectric pump preferably for use in transporting fluid by applying a voltage to a piezoelectric element in order to bend a diaphragm.

2. Description of the Related Art

Piezoelectric micro pumps are used, for example, as coolant supply pumps in small electronic appliances, such as notebook PCs or as fuel supply pumps in fuel cells. Piezoelectric micro pumps utilize diaphragms that bend when a voltage is applied to piezoelectric elements. Piezoelectric micro pumps have advantages in that they have simple structures, low-profile shapes, and low power-consumption properties.

Conventionally, a diaphragm unit in a piezoelectric micro pump, which includes a diaphragm on which a piezoelectric element is bonded, typically has a unimorph structure, in which a single-layer piezoelectric element is bonded to the diaphragm, or a bimorph structure, in which a multilayer piezoelectric element is bonded to the diaphragm. In particular, to drive the diaphragm unit at a relatively low frequency in a hydraulic pump, for example, the bimorph structure is more efficient than the unimorph structure. To drive the diaphragm unit at a high frequency in a pneumatic pump, for example, the unimorph structure is advantageous.

In the unimorph structure, a piezoelectric element that expands and contracts in directions parallel to the surface thereof is bonded to a diaphragm that does not expand and contract. The unimorph structure usually has a neutral plane with respect to bending in the piezoelectric element. The term "neutral plane" refers to a plane in which a compressive stress and a tensile stress in the diaphragm unit are zero, when the entire diaphragm unit bends. When a neutral plane exists in the piezoelectric element, a portion of the piezoelectric element moves so as to resist bending, which causes a problem in that the displacement of the diaphragm unit is reduced and/or unwanted heat is generated.

Japanese Unexamined Patent Application Publication No. 2001-260348 discloses an inkjet recording head using a diaphragm unit having a unimorph structure. In this case, the thicknesses of a diaphragm and a piezoelectric element are appropriately set such that a neutral plane is positioned in the diaphragm so as to prevent a portion of the piezoelectric element from moving so as to act against bending.

On the other hand, with a diaphragm unit in which a diaphragm is bonded to a piezoelectric element having a bimorph structure, it is impossible to position the neutral plane in the diaphragm regardless of the thicknesses of the diaphragm and the piezoelectric element, because the piezoelectric element itself bends. Therefore, a portion of the piezoelectric element moves so as to act against bending, thereby decreasing the amount of displacement and the pump efficiency and increasing unwanted heat generation.

SUMMARY OF THE INVENTION

To overcome the problems described above, preferred embodiments of the present invention provide an efficient piezoelectric pump by eliminating factors that hinder the displacement of a piezoelectric element from a diaphragm-type piezoelectric pump using a bimorph piezoelectric element.

A preferred embodiment of the present invention provides a piezoelectric pump including a pump body having an opening, a diaphragm that is fixed to the pump body and arranged to close the opening, the diaphragm defining a pump chamber between the diaphragm and the pump body, and a piezoelectric element bonded to a surface of the diaphragm, wherein the diaphragm and the piezoelectric element bonded thereto define a diaphragm unit, the diaphragm unit is arranged to bend when a voltage is applied to the piezoelectric element, the piezoelectric element is a bimorph piezoelectric element in which a plurality of piezoelectric layers are stacked, among the plurality of piezoelectric layers, at least one layer disposed in the approximate middle of the piezoelectric element in the thickness direction is a neutral layer that is not displaced when a voltage is applied, and a neutral plane of the diaphragm and the piezoelectric element bonded thereto is located in the neutral layer of the piezoelectric element.

A bimorph piezoelectric element includes layers that expand and layers that contract when a voltage is applied thereto. If the magnitude of a driving voltage applied to a piezoelectric element and the degree of polarization is uniform or substantially uniform, the midplane in the thickness direction, i.e., the boundary between the expanding layers and contracting layers, is the plane in which expansion and contraction are reversed. However, when a bimorph piezoelectric element is bonded to a diaphragm, the neutral plane of a diaphragm unit including the diaphragm and the piezoelectric element bonded thereto deviates from the midplane of the piezoelectric element in the thickness direction, and a portion of the piezoelectric element moves so as to resist bending. That is, a compressive stress is applied to a portion of an expanding layer, while a tensile stress is applied to a portion of a contracting layer.

In preferred embodiments of the present invention, a neutral layer is disposed in the approximate middle of a piezoelectric element in the thickness direction so that the neutral plane is located in the neutral layer in the diaphragm unit, such that all portions of the piezoelectric element are prevented from moving so as to resist bending. In particular, even if the deviation of the neutral plane from the midplane of the piezoelectric element in the thickness direction varies due to variations in the thicknesses of diaphragm or piezoelectric layers or due to the unevenness of adhesion between the diaphragm and a piezoelectric layer, the neutral plane can be accurately located in the thickness direction of the neutral layer because the neutral layer has a desired thickness.

A piezoelectric element used in the piezoelectric pump preferably includes a stack of a plurality of piezoelectric layers. That is, the piezoelectric element is made by pressing a stack of piezoelectric green sheet layers with electrodes disposed therebetween, firing the stack, and then polarizing the stack. Therefore, as compared to a conventional bimorph piezoelectric element in which fired piezoelectric plates are bonded with an adhesive, the piezoelectric element can advantageously be configured to have a low profile and a low drive voltage, whereby a small and low-voltage-drive pump is provided. Among the plurality of piezoelectric layers included in the piezoelectric element, at least one layer positioned in the approximate middle of the piezoelectric element in the thickness direction is the neutral layer that is not displaced when a voltage is applied. The neutral layer, which is not displaced when a voltage is applied, may preferably be one of three types, for example. A first type of layer is polarized in the thickness direction but is not subjected to an electric field, a second type of layer is not polarized but is subjected to an electric field, and a third type of layer is not polarized and is not subjected to an electric field. The neutral layer is preferably not subjected to an electric field when electrodes on both sides of the neutral layer have the same potential, including a ground potential. In either case, the neutral layer does not expand and contract when a voltage is applied to the piezoelectric element.

Instead of the neutral layer, a non-piezoelectric layer made of resin, metal, or other suitable material, for example, may preferably be provided. In this case, two piezoelectric layers must be bonded so as to sandwich the non-piezoelectric layer, which disadvantageously complicates the manufacturing of the piezoelectric element, which results in varying the quality including the evenness of the neutral plane, and increases the thickness of the piezoelectric element. In contrast, when the neutral layer is defined by a piezoelectric layer, all of the piezoelectric layers included in the piezoelectric element can be stacked at the same time, which facilitates manufacturing, stabilizes the quality, and decreases the thickness of the piezoelectric element.

As described above, it is not necessary that the neutral layer be polarized. However, it is preferable that all of the piezoelectric layers including the neutral layer are polarized in the thickness direction, and that the neutral layer is not subjected to an electric field when a voltage is applied. For example, when only the neutral layer is unpolarized, strain or stress may be generated between a polarized layer and an unpolarized layer due to a difference in the degree of polarization when the piezoelectric element is being polarized, which may generate cracks or other defects. Moreover, when the piezoelectric element is being driven, cracks or other defects may be readily generated between a polarized layer and an unpolarized layer due to a residual stress generated when the piezoelectric element was being polarized. In contrast, when the neutral layer is polarized along with the other piezoelectric layers, strain and stress due to a difference in the degree of polarization can be suppressed, and the generation of cracks or other defects can be prevented.

In general, the neutral plane of a diaphragm unit is deviated from the center of the piezoelectric element in the thickness direction towards a diaphragm. The amount of the deviation depends on the Young's modulus and/or the thickness of the diaphragm. Therefore, the number of stacked piezoelectric layers provided between the neutral layer and the diaphragm may be less than the number of stacked piezoelectric layers provided farther from the diaphragm than the neutral layer. That is, the neutral layer is preferably not disposed at the center of the piezoelectric element in the thickness direction but is disposed at a location that is deviated towards the diaphragm. With this structure, even if the neutral layer is relatively thin, the neutral plane can be easily located in the neutral layer.

As described above, according to various preferred embodiments of the present invention, in a piezoelectric pump using a piezoelectric element having a bimorph structure, a neutral layer, which is not displaced, is disposed in the approximate middle of the piezoelectric element in the thickness direction such that the neutral plane of the diaphragm unit is located in the neutral layer. Therefore, when the diaphragm unit bends, the generation of a portion in the piezoelectric element that resists the displacement is prevent, whereby an efficient piezoelectric pump is produced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
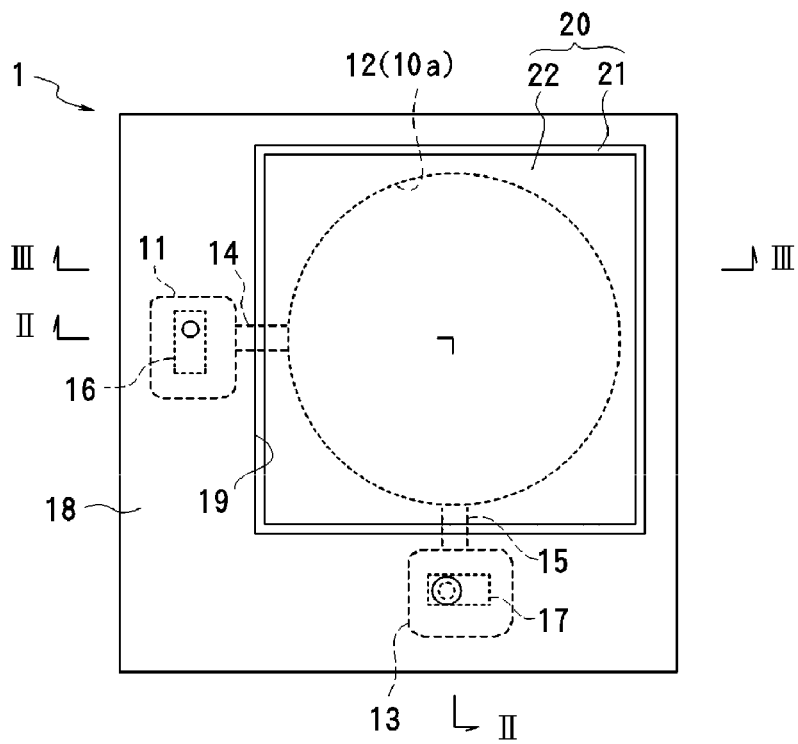
FIG. 1 is a sectional view of a piezoelectric pump according to a first preferred embodiment of the present invention.
Figure 2:
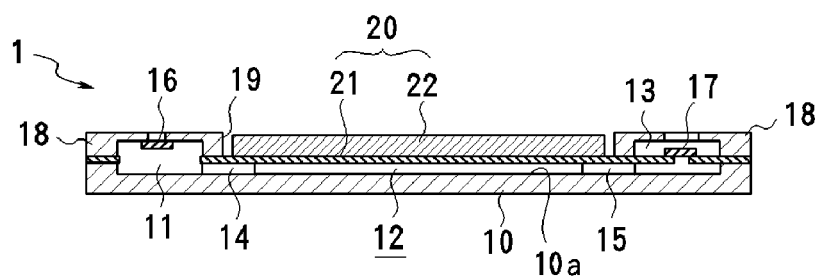
FIG. 2 is a sectional view taken along line II-II of FIG. 1.
Figure 3:
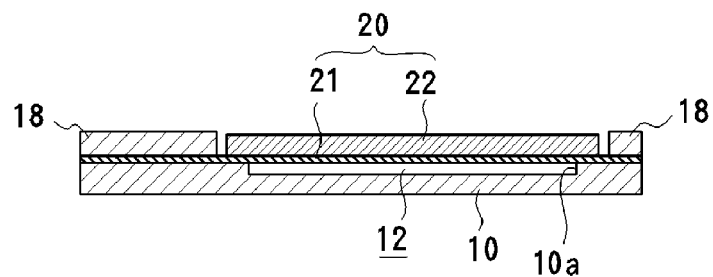
FIG. 3 is a sectional view taken along line III-III of FIG. 1.

Hereinafter, preferred embodiments of the present invention are described with reference to drawings.
First Preferred Embodiment FIGS. 1 to 3 show a piezoelectric pump according to a first preferred embodiment of the present invention. FIG. 1 is a plan view of a piezoelectric pump; FIG. 2 is a sectional view taken along line II-II of FIG. 1; and FIG. 3 is a sectional view taken along line III-III of FIG. 1.

A piezoelectric pump 1 preferably includes a pump body 10, a diaphragm unit 20 including a piezoelectric element 22 that is bonded to a diaphragm 21, and a press plate 18. The pump body 10 is preferably made of a high-rigidity material, such as a metal or a resin, for example. A pump chamber 12 is defined between the pump body 10 and the diaphragm unit 20. Between the pump body 10 and the press plate 18, an input valve chamber 11, which communicates with the pump chamber 12 via a connection channel 14, and an output valve chamber 13, which communicates with the pump chamber 12 via a connection channel 15, are provided. An input check valve 16 is disposed in the input valve chamber 11. The input check valve 16 is arranged to allow fluid to flow from an input port to the input valve chamber 11 and to prevent fluid from flowing in the opposite direction. An output check valve 17 is disposed in the output valve chamber 13. The output check valve 17 is arranged to allow fluid to flow from the pump chamber 12 to the output valve chamber 13 and to prevent fluid from flowing in the opposite direction.

The pump chamber 12 is preferably a flat space having a dimension in the height direction less than dimensions in planar directions, for example. The pump chamber 12 is defined by covering a recess 10a in the pump body 10 with the diaphragm 21. The pump body 10 may preferably be made of a metallic or resin material, for example. Although the pump chamber 12 is preferably substantially circular, for example, in the first preferred embodiment, the pump chamber 12 may alternatively be rectangular, for example.

The diaphragm 21 is preferably made of a thin elastic plate, for example. Preferably, the diaphragm 21 is arranged over substantially the entire top surface of the pump body 10, and is fixed between the top surface and the press plate 18 by an adhesive, for example. Although the material for the diaphragm 21 is not particularly limited, it is preferable that the diaphragm be made of a thin plate with a relatively low Young's modulus, such as a glass epoxy board, a resin sheet, or a rubber sheet, for example. With such a diaphragm, the amount of displacement is large, because the diaphragm does not resist the movement of a piezoelectric body. In contrast, if a diaphragm having a high Young's modulus, such as a metal sheet, for example, is used, a high-pressure pump is produced, although the amount of displacement is relatively small. The piezoelectric element 22 is bonded to an outer surface, i.e., the surface farther from the pump chamber 12, of the diaphragm 21. Although the area of the piezoelectric element 22 is preferably greater than that of the pump chamber 12 in the first preferred embodiment, the area of the piezoelectric element 22 may be equal to or less than that of the pump chamber 12. Because the diaphragm 21 is preferably disposed over substantially the entire top surface of the pump body 10 in the first preferred embodiment, the diaphragm 21 defines not only a protective sheet arranged to prevent liquid in the pump chamber 12 from contacting the piezoelectric element 22, but also a package arranged to prevent the liquid from leaking from the pump chamber 12. The press plate 18 includes a window opening 19 in the area corresponding to the piezoelectric element 22. The back side of the piezoelectric element 22 is open to the outside of the pump chamber 12.

Figure 4:
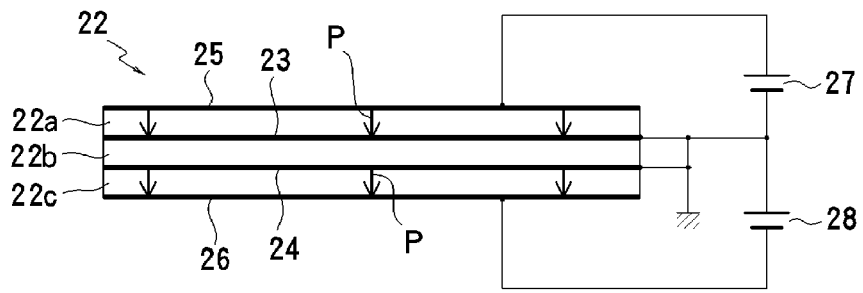
FIG. 4 is a sectional view of an example of a piezoelectric element when the piezoelectric element is being polarized.
Figure 5:
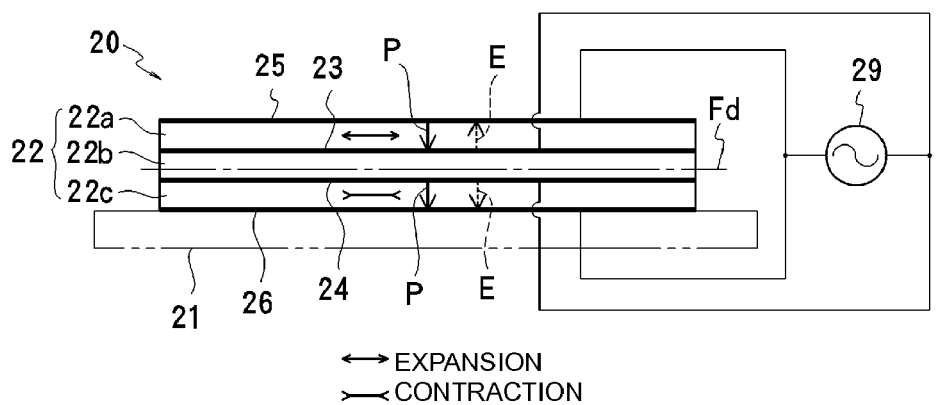
FIG. 5 is a sectional view of an example of a piezoelectric element when the piezoelectric element is being driven.

FIGS. 4 and 5 show the structure of an example of the piezoelectric element 22. FIG. 4 shows a state in which the piezoelectric element is being polarized, and FIG. 5 shows a state in which the piezoelectric element is being driven. The piezoelectric element 22 is preferably made by stacking three piezoelectric layers 22a to 22c, each composed of a piezoelectric ceramic, for example, while interposing electrodes 23 and 24 therebetween, firing the stack, forming electrodes 25 and 26 on the front and back sides of the stack, and then polarizing the stack. As shown in FIG. 5, the piezoelectric element 22 is bonded face-to-face to the diaphragm 21.

As shown in FIG. 4, in order to polarize the piezoelectric element, two DC power sources 27 and 28 are connected in series, the positive terminal of the DC power source 27 is connected to the front-side electrode 25, the negative terminal of the DC power source 28 is connected to the back-side electrode 26, and the interlayer electrodes 23 and 24 are connected to a point between the DC power sources 27 and 28 and to ground. By applying a DC electric field to the piezoelectric element, the piezoelectric layers including the layers 22a and 22c, but excluding the intermediate layer 22b, are polarized in the same thickness direction, as shown by an arrow P in FIG. 4. FIG. 4 shows an example in which the electrodes 23 to 26 are full-surface electrodes. However, the electrodes 23 to 26 may be partial electrodes which cover only the area corresponding to the pump chamber 12. The intermediate piezoelectric layer 22b is a neutral layer, which is not polarized. In the present preferred embodiment, the neutral layer 22b is positioned at the approximate center of the piezoelectric element 22 in the thickness direction, and the neutral layer 22b preferably has substantially the same thickness as the other piezoelectric layers 22a and 22c, for example. As described below, the thickness and position of the neutral layer 22b are set such that a neutral plane Fd is located in the neutral layer 22b.

As shown in FIG. 5, in order to drive the piezoelectric element, one terminal of an AC power source 29 is connected to the front-side and back-side electrodes 25 and 26, and the other terminal of the AC power source 29 is connected to the interlayer electrodes 23 and 24. With this connection configuration, an electric field E as indicated by a dotted arrow in FIG. 5 is applied to the piezoelectric element. When the upper piezoelectric layer 22a expands, the lower piezoelectric layer 22c contracts, and the diaphragm unit 20 bends to be upwardly convex. When the direction of the electric field is reversed, the upper piezoelectric layer 22a contracts and the lower piezoelectric layer 22c expands, and the diaphragm unit 20 bends to be downwardly convex. In this manner, the diaphragm unit 20 performs bending vibration. Because the neutral layer 22b is not polarized, the neutral layer does not expand and contract. Even if the neutral layer 22b is polarized in either direction, the neutral layer 22b does not expand and contract with the wiring shown in FIG. 5, because the interlayer electrodes 23 and 24 sandwiching the neutral layer 22b have the same potential.

A neutral plane Fd is positioned at a location at which compressive stress and tensile stress are zero when the diaphragm unit 20 bends. The neutral plane Fd is deviated from the center of the piezoelectric element 22 in the thickness direction toward the diaphragm 21, because the piezoelectric element 22 is bonded to the diaphragm 21. Preferred embodiments of the present invention are configured such that the neutral plane Fd is located in the neutral layer 22b of the piezoelectric element 22. Therefore, no portion in the piezoelectric element 22 moves so as to resist bending of the piezoelectric element 22, whereby the diaphragm unit 20 can be displaced by a large amount, and thus, the pump efficiency is improved. The positioning of the neutral plane Fd depends on the material and thickness of the neutral layer 22b and on the material and thickness of the diaphragm 21.

Figure 6A:
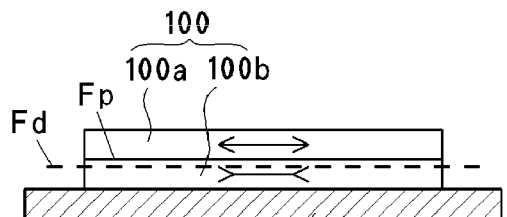
FIGS. 6A and 6B are views showing locations of neutral planes of a conventional diaphragm unit (FIG. 6A) and a diaphragm unit according to a preferred embodiment of the present invention (FIG. 6B).
Figure 6B:
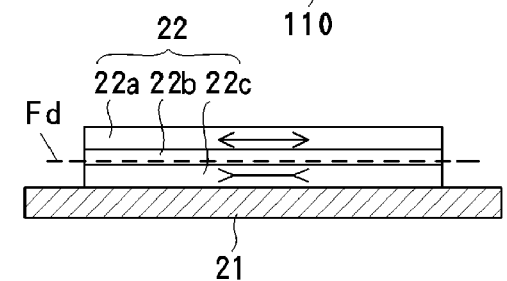

FIGS. 6A and 6B shows a comparison of locations of the neutral plane Fd in a conventional diaphragm unit and in the diaphragm unit according to a preferred embodiment of the present invention. The conventional diaphragm unit shown in FIG. 6A is configured such that a two-layered bimorph piezoelectric element 100 including piezoelectric layers 100a and 100b is bonded to a diaphragm 110. The diaphragm unit shown in FIG. 6B according to a preferred embodiment of the present invention is configured such that the three-layered piezoelectric element 22 including the intermediate neutral layer 22b is bonded to the diaphragm 21, as shown in FIG. 5.

With the conventional diaphragm unit shown in FIG. 6A, the neutral plane Fd with respect to bending is located in the lower piezoelectric layer 10b, which is deviated from the midplane Fp of the piezoelectric element in the thickness direction toward the diaphragm 110. For example, when the upper piezoelectric layer 100a expands and the lower piezoelectric layer 100b contracts, the diaphragm unit shown in FIG. 6A is displaced so as to become upwardly convex. Although the region between the neutral plane Fd and the midplane Fp in the piezoelectric layer 100b tends to contract, a force, i.e., a tensile stress, is applied to the region so as to expand the region. Therefore, a portion in the piezoelectric element 100 moves so as to resist bending.

In contrast, with the diaphragm unit shown in FIG. 6B according to a preferred embodiment of the present invention, because the neutral plane Fd is located in the neutral layer 22b, there are no portions in the piezoelectric layers 22a to 22c in which an expansion force and a contraction force oppose each other when the upper piezoelectric layer 22a expands and the lower piezoelectric layer 22b contracts, i.e., when the diaphragm unit shown in FIG. 6B is displaced so as to be upwardly convex. Therefore, the piezoelectric element 22 can freely bend, thereby increasing the amount of displacement of the piezoelectric element 22 and the diaphragm unit.

Second Preferred Embodiment

Figure 7:
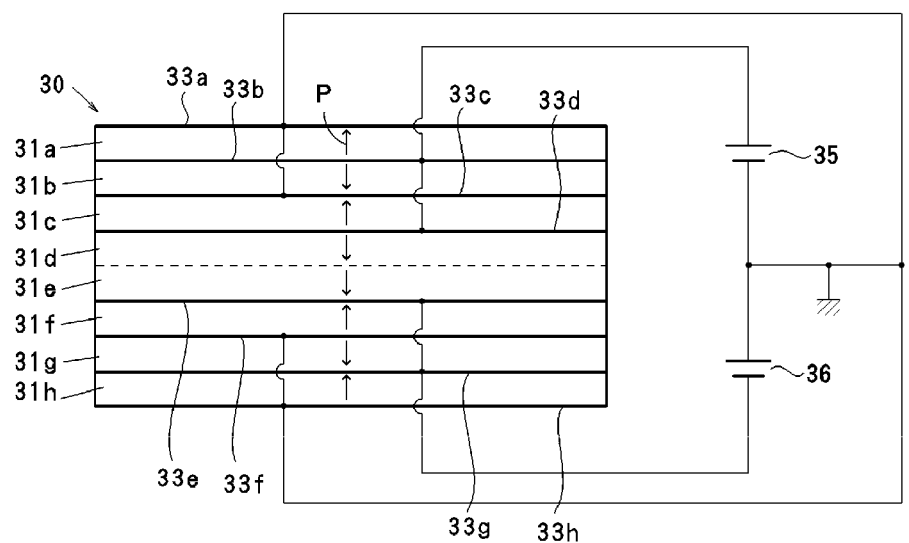
FIG. 7 is a sectional view of a piezoelectric element according to a second preferred embodiment of the present invention when the piezoelectric element is being polarized.
Figure 8:
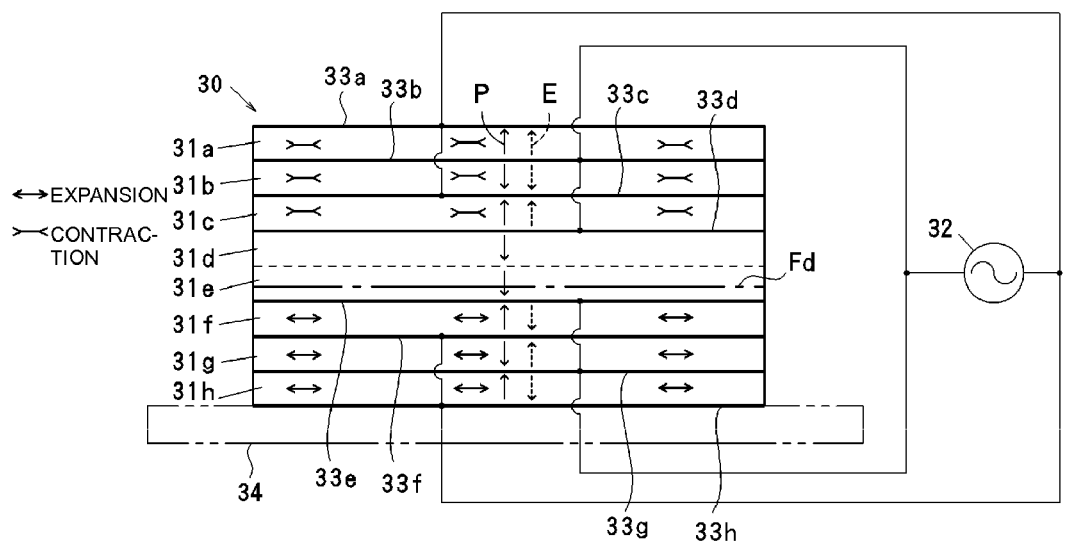
FIG. 8 is a sectional view of a diaphragm unit using the piezoelectric element shown in FIG. 7 when the diaphragm unit is being driven.

FIGS. 7 and 8 show a second preferred embodiment of the present invention. FIG. 7 shows a state in which a piezoelectric element 30 is being polarized, and FIG. 8 shows a state in which the diaphragm unit is being driven. In the second preferred embodiment, the piezoelectric element 30 includes a stack of eight piezoelectric layers 31a to 31h, preferably including two neutral piezoelectric layers 31d and 31e in the approximate middle in the thickness direction, for example. Although no electrodes are disposed between the neutral layers 31d and 31e in the second preferred embodiment, the electrodes may be disposed therebetween. The piezoelectric element 30 is bonded onto a diaphragm 34.

As shown in FIG. 7, in order to polarize the piezoelectric element, two DC power sources 35 and 36 are connected in series, the positive terminal of the DC power source 35 is connected to electrodes 33b and 33d, the negative terminal of the DC power source 36 is connected to electrodes 33e and 33g, and the other electrodes 33a, 33c, 33f, and 33h are connected to a point between the DC power sources 35 and 36 and to ground. By applying a DC electric field to the piezoelectric element, the piezoelectric layers 31a to 31d above the center, i.e., farther from the diaphragm 34, of the piezoelectric element in the thickness direction are polarized such that the piezoelectric layers adjacent to each other in the thickness direction are polarized in opposite directions. Likewise, the piezoelectric layers 31e to 31h below the approximate center, i.e., closer to the diaphragm 34, of the piezoelectric element in the thickness direction are polarized such that the piezoelectric layers adjacent to each other in the thickness direction are polarized in opposite directions. The neutral layers 31d and 31e, which are disposed in the approximate middle, are polarized in the same thickness direction. Solid arrows P indicate the directions in which the layers are polarized. When polarization is performed in this manner, each piezoelectric layer can be uniformly polarized to substantially the same degree with a small amount of wiring.

As shown in FIG. 8, in order to drive the piezoelectric element, one terminal of the AC power source 32 is connected to, the first electrode 33a, the third electrode 33c, the sixth electrode 33f, and the eighth electrode 33h. The other terminal of the AC power source 32 is connected to the second electrode 33b, the fourth electrode 33d, the fifth electrode 33e, and the seventh electrode 33g. With this connection configuration, an electric field E as indicated by a dotted arrow in FIG. 8 is applied to the piezoelectric layers. When the upper three piezoelectric layers 31a to 31c expand, the lower three piezoelectric layers 31f to 31h contract, and the diaphragm unit is displaced to be upwardly convex. When the direction of the electric field is reversed, the diaphragm unit is displaced to be downwardly convex. Although the neutral layers 31d and 31e are polarized in a thickness direction, a driving electric field is not applied to the neutral layers 31d and 31e because the electrodes 33d and 33e have the same potential, and the neutral layers 31d and 31e are not displaced.

Also in the present preferred embodiment, there are no portions in the piezoelectric element 30 that act against bending, because the neutral plane Fd is located in the neutral layers 31d and 31e. Therefore, the diaphragm unit can preferably be displaced by a large amount. Moreover, the neutral layers 31d and 31e, in addition to the piezoelectric layer 31a to 31c and 31f to 31h, are polarized to substantially the same degree in the thickness direction. Therefore, the entire piezoelectric element is uniformly polarized, and the amounts of strain and residual stress which are generated at the boundary between the neutral layers 31d and 31e and the piezoelectric layers 31c to 31f due to the difference in the degree of polarization are very small. Furthermore, a stress, which is generated at the boundary between a contracting area and a neutral area when the piezoelectric element bends, is relatively small, whereby the generation of cracks or other defects is prevented.

Third Preferred Embodiment

Figure 9:
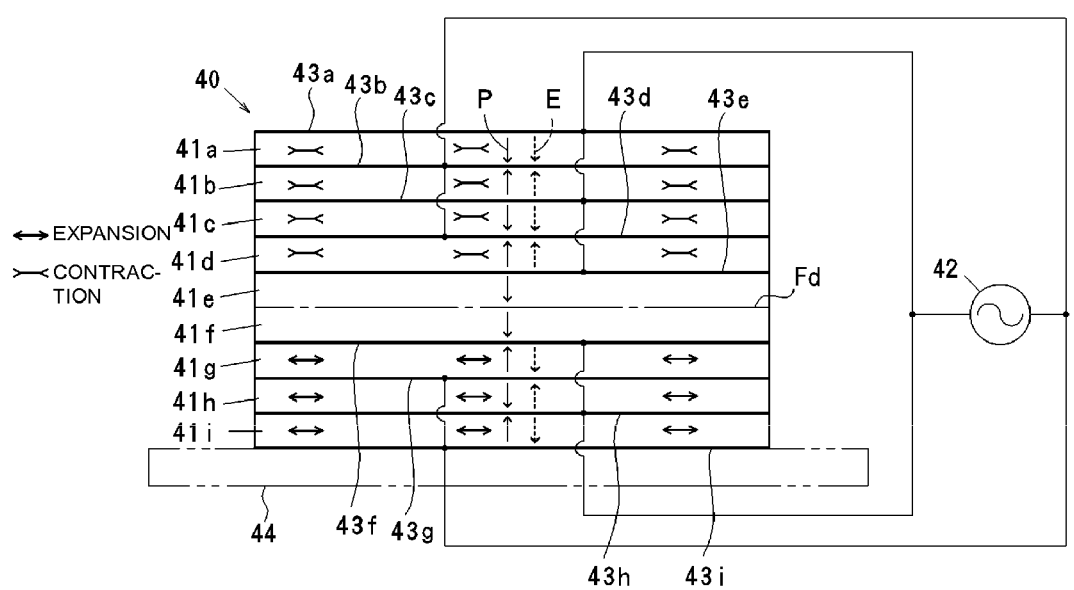
FIG. 9 is a sectional view of a diaphragm unit according to a third preferred embodiment of the present invention when the diaphragm unit is being driven.

FIG. 9 shows a diaphragm unit according to a third preferred embodiment of the present invention. The third preferred embodiment is a modification of the second preferred embodiment. A piezoelectric element 40 includes a stack of nine piezoelectric layers 41a to 41i, including two piezoelectric layers 41e and 41f in the approximate middle in the thickness direction. Although no electrodes are disposed between the neutral layers 41e and 41f in the present preferred embodiment, electrodes may be disposed therebetween. Electrodes 43a to 43i are disposed on the front and back surfaces of the piezoelectric element 40 and between the layers. The piezoelectric element 40 is bonded onto a diaphragm 44.

One terminal of an AC power source 42 is connected to the first electrode 43a, the third electrode 43c, the fifth electrode 43e, the sixth electrode 43f, and the eighth electrode 43h. The other terminal of the AC power source 42 is connected to the second electrode 43b, the fourth electrode 43d, and the seventh electrode 43g. Therefore, when an electric field is applied as indicated by a dotted arrow E in FIG. 9, the four upper piezoelectric layers 41a to 41d expand while the three lower piezoelectric layers 41g to 41i contract, and the diaphragm unit is displaced to bee upwardly convex. When the direction of the electric field is reversed, the diaphragm unit is displaced to be downwardly convex. Although the neutral layers 41e and 41f are polarized in a thickness direction, a driving electric field is not applied to the neutral layers 41e and 41f because the electrodes 43e and 43f have the same potential, and the neutral layers 41e and 41f are not displaced.

In the present preferred embodiment, the number of piezoelectric layers above the neutral layers 41e and 41f and the number of piezoelectric layers below the neutral layers are preferably different. In particular, four piezoelectric layers are disposed above the neutral layers and three piezoelectric layers are disposed below the neutral layers. If, as shown in FIG. 8, the neutral layers 31d and 31e are disposed in the approximate middle of the piezoelectric element 30 in the thickness direction, the neutral plane Fd is deviated from the center of the piezoelectric element 30 in the thickness direction toward the diaphragm 34, and the neutral plane Fd may be located close to the driving piezoelectric layer 31f, whereby the neutral plane Fd may possibly resist the displacement of the piezoelectric layer 31f. In contrast, when the number of the upper piezoelectric layers and the lower piezoelectric layers are different such that the number of upper piezoelectric layers is greater than the number of lower piezoelectric layers as shown in FIG. 9, the neutral plane Fd can preferably be located at the approximate center of the neutral layers 41e and 41f, and the resistance of the neutral plane Fd against the displacement of the driving layers (piezoelectric layers) 41d and 41g sandwiching the neutral layers 41e and 41f is reduced.

FIG. 9 only shows an example in which the numbers of piezoelectric layers disposed above and below the neutral layers are different. The number of piezoelectric layers disposed above and below the neutral layers can be arbitrarily set in accordance with the location of the neutral plane Fd. That is, because the location of the neutral plane Fd depends on the thickness and the material of the diaphragm 44, the number of piezoelectric layers disposed above and below the neutral layers may be selected accordingly. Instead of making the number of piezoelectric layers above and below the neutral layers different, the magnitude or degree of polarization of the driving electric field applied to the piezoelectric layer disposed farther from the diaphragm may preferably be greater than the magnitude or degree of polarization of the driving electric field applied to the piezoelectric layers disposed closer to the diaphragm, for example. As a further alternative, the thickness of the piezoelectric layers disposed farther from the diaphragm may preferably be greater while the magnitude and degree of polarization of the electric field are maintained constant, for example.

FIGS. 1 to 3 show a structure in which the pump body 10 has a substantially flat shape, and the input valve chamber 11, the pump chamber 12, and the output valve chamber 13 are disposed on the same or substantially the same plane. However, the invention is not limited to this structure. Because the piezoelectric pump shown in FIGS. 1 to 3 has a low profile, the piezoelectric pump is suitable for use as a coolant transport pump in a small electronic appliance, such as a notebook PC or a portable appliance, or a fuel transport pump in a fuel cell, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric pump comprising:
   a pump body including an opening;
   a diaphragm fixed to the pump body and arranged to close the opening, the diaphragm defining a pump chamber between the diaphragm and the pump body; and
   a piezoelectric element bonded only to a surface of the diaphragm opposite the pump chamber; wherein
   the diaphragm and the piezoelectric element are bonded to each other so as to define a diaphragm unit, the diaphragm unit being arranged to bend when a voltage is applied to the piezoelectric element; wherein
   the piezoelectric element comprises a stack of at least three piezoelectric material layers; wherein
   at least one of the at least three piezoelectric material layers is a neutral layer, the at least one neutral layer being stacked between piezoelectric material layers which expand and contract when a voltage is applied to the piezoelectric element; wherein the at least one neutral layer does not expand or contract when a voltage is applied to the piezoelectric element; and wherein
   when the diaphragm unit bends there is a neutral meeting point, at which compressive stress and tensile stress are zero, that extends through the at least one neutral layer along a curve thereof.

2. The piezoelectric pump according to claim 1, wherein all of the at least three piezoelectric material layers, including the neutral layer, are polarized in a thickness direction; and wherein an electric field is not applied to the neutral layer when a voltage is applied to the piezoelectric element.

3. The piezoelectric pump according to claim 1, wherein a number of the at least three of piezoelectric material layers disposed between the neutral layer and the diaphragm is less than a number of the at least three of piezoelectric material layers disposed farther from the diaphragm than the neutral layer.

* * * * *